United States Patent [19]
Fahrenberg et al.

[11] Patent Number: 5,944,974
[45] Date of Patent: Aug. 31, 1999

[54] PROCESS FOR MANUFACTURING MOLD INSERTS

[76] Inventors: Jens Fahrenberg, Lauterstrasse 12a, 76344 Eggenstein-Leopoldshafen; Klaus Bade, Lessingstrasse 12, 76135 Karlsruhe; Werner Schomburg, Pfinztalstrasse 6, 76327 Pfinztal, all of Germany

[21] Appl. No.: 08/994,085

[22] Filed: Dec. 19, 1997

Related U.S. Application Data

[63] Continuation-in-part of application No. PCT/EP96/02172, May 21, 1996.

[30] Foreign Application Priority Data

Jul. 1, 1995 [DE] Germany ............................ 195 24 099

[51] Int. Cl.$^6$ ...................................................... C25D 1/10
[52] U.S. Cl. ................................................................ 205/70
[58] Field of Search ..................... 205/70, 127; 430/302, 430/904

[56] References Cited

U.S. PATENT DOCUMENTS

| | | | |
|---|---|---|---|
| 3,929,591 | 12/1975 | Chu et al. | 204/17 |
| 5,234,571 | 8/1993 | Noeker | 205/70 |
| 5,501,784 | 3/1996 | Lessmollmann et al. | 205/67 |
| 5,733,708 | 3/1998 | Cantanzaro et al. | 430/296 |

*Primary Examiner*—Kathryn Gorgos
*Assistant Examiner*—Erica Smith-Hicks
*Attorney, Agent, or Firm*—Klaus J. Bach

[57] ABSTRACT

In a method of manufacturing mold inserts by galvanic metal deposition a substrate consisting of an electrically conductive material which cannot be structured lithographically is structured by mechanical precision machining to provide different levels on the substrate which is then covered by an electrically insulating material which can be structured lithographically and which is fine structured by depth lithography to form cavities therein which are then filled by galvanic deposition of a metal layer. The metal structure so formed is then separated from the substrate and the electrically non-conductive material to provide the mold insert with projections of different heights.

3 Claims, 2 Drawing Sheets

PROCESS FOR MANUFACTURING MOLD INSERTS

This is a continuation in part application of international application PCT/EP96/02172 filed May 21, 1996 and claiming the priority of German application 19524099.5 filed Jul. 1, 1995.

BACKGROUND OF THE INVENTION

The invention resides in a method of manufacturing mold inserts by the galvanically depositing a metal in cavities formed in an electrically insulating material disposed on an electrically conductive substrate and then removing the metal from the substrate and other structures.

Microstructures are manufactured in large numbers and at low costs mold thermoplastic materials in molding processes such as injection molding and hot deformation. The forming elements in such molding processes are mold inserts which are brought into contact with the plastic at raised temperatures. The relief of the microstructures formed by such a molding procedure is therefore determined essentially by the three-dimensional shape of the surface of the form insert.

In the publication "Molding of Three Dimensional Microstructures by the LIGA Process" in the Proceedings of the Conference MEMS '92, which was held in 1992 in Travenmünde, Germany, the authors, M. Harmening et al., describe on pages 202 to 207 a method for manufacturing mold inserts with several structure planes. In this process, first, a mold insert is made by X-ray depth lithography and galvanic deposition of nickel which mold insert is then used to produce a single plane microstructure of PMMA by molding. This single plane microstructure of PMMA is then structured by X-ray depth lithography in such a way that another structure plane is generated. From this microstructure, a mold insert with two structure planes is formed by another galvanic nickel deposition. With repeated application of this process mold inserts of complex shapes and very small structural dimensions can be made. The process however has the disadvantage that several irradiation procedures at a synchrotron site are required during manufacture. As a result, the manufacturing costs are relatively high.

In the publication "Microvalve System Fabricated by Thermoplastic Molding" by J. Fahrenberg et al., presented in the Workshop Digest of the Conference Micro-Mechanics Europe '94, which was held in 1994 in Pisa, there is described on pages 178–181 a microvalve system produced by molding utilizing a mold insert with four structure planes. This mold insert was made by precision mechanical working of a brass plate. However, with such a process, very small structures cannot be generated because the smallest available cutting heads have a diameter of about 300 $\mu$m so that certain minimum dimensions are given.

It is the object of the present invention to provide a method of making mold inserts, which, on one hand, have complex three dimensional shapes and, on the other, have very small structures.

SUMMARY OF THE INVENTION

In a method of manufacturing mold inserts by galvanic metal deposition, a substrate consisting of an electrically conductive material which cannot be structured lithographically is structured by mechanical precision machining to provide different levels on the substrate which is then covered by an electrically insulating material which can be structured lithographically and which is fine-structured by depth lithography to form cavities therein which are subsequently filled by galvanic deposition of a metal layer. The metal structure so formed is then separated from the substrate and the electrically non-conductive material to provide the mold insert with projections of different heights.

Below two embodiments of the invention will be described in detail on the basis of the accompanying drawings.

DESCRIPTION OF THE PREFERRED EMBODIMENTS

Figure 1:
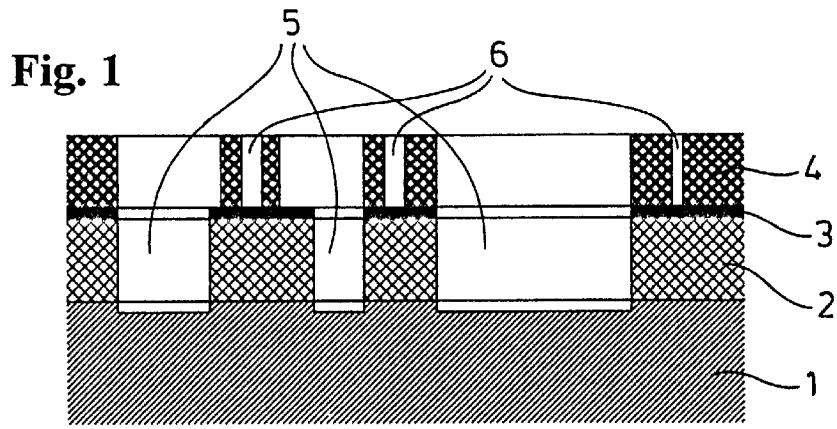
FIG. 1 shows the manufacture of a mold insert by milling of a substrate.

The figures show schematically the various method steps. In the first example as given in FIG. 1, there is shown schematically the milling procedure for forming a substrate provided with an x-ray sensitive and an x-ray insensitive resist layer. A 500 $\mu$m thick layer 2 of an epoxy resin was applied to a substrate 1 of copper. An about 100 nm thin electrically conductive gold layer 3 was deposited on the epoxy resin layer 2 by magnetron atomization and a 300 $\mu$m thick layer 4 of polymethylmetacrylate was polymerized on the gold layer 3. This compound layer was precision cut by a milling head having a diameter of 300 $\mu$m such that in certain areas all the material was removed and cavities 5 were formed. The material was further removed up to a depth of about 20 $\mu$m into the surface of the copper substrate 1 in order to insure that, inspite of a certain unevenness of the substrate 1, a continuous electrically conductive surface was exposed. With the well known methods of x-ray depth lithography, the layer 4 of PMMA was exposed by means of irradiation with x-rays in a synchrotron utilizing a mask adjusted to the structures milled into the compound layer. The areas exposed to x-rays were then dissolved in a developer solution such that cavities 6 were formed in the PMMA, wherein the electrically conductive gold layer 3 was exposed. The epoxy resin 2 was not removed by the x-ray irradiation and the application of the developer because of the chemical composition of epoxy resin.

It is possible to make the electrically insulating layer 4 of the material, which can be structured by photolithography or by electrolithography and to structure such material layer 4 by the respective lithographic method when the electrically insulating layer 2 cannot be structured with the respective process. Accordingly, for example, A–Z lacquers and polyamides are suitable for a photolithographic structuring whereas layers on PMMA basis are suitable in the electrolithography. However, it is also possible to provide, above the insulating layer 4, another layer which can be structured by another process. It is for example possible to provide on a layer 4, which can be structured by x-ray depth lithography, an AZ lacquer which can be structured by photolithography before the layer 4 is structured by x-ray depth lithography.

Instead of the epoxy layer 2 other electrically non-conductive layers can be used which are not affected by the lithographic structuring procedure used on the layer 4. Particularly suitable for such a procedure are materials which are easy to work mechanically, which can be easily deposited on the substrate 1 and adhere well to the substrate 1 and which have a high mechanical strength. Suitable for this purpose are, for example, expoxiphenol resins, polyaxid methylene, polysulfane, polycarbonate.

In a sample an electric contact was established on the backside of the copper substrate 1 and nickel was galvanically deposited on the copper substrate in a galvanizing bath. During the process, the sample was disposed in a suitable casing which insured that only the surfaces of the copper substrate 1 in the cavities 5 and 6 came into contact with the galvanic bath. The galvanic deposition first started only on the electrically contacted surfaces in the cavities 5. With the electrically insulated walls of the epoxy resin layer 2, it was insured that the galvanic deposition grew on the copper surface. With a galvanic deposition into the cavities 6, which are much deeper than they are wide, it is possible that the cavities are not completely filled with the metal deposited if the galvanic deposition can also occur on the walls of the cavities as, in that case, partial volumina can be formed which can no longer be accessed by electrolyte disposed on the outside. This could happen especially when the ratio of the depth of the cavities 5 and 6 to their width is greater than about 5. Cavities, which are not completely filled with metal may result in weak sections in the nickel of the mold insert to be produced and such conditions should therefore be avoided. Since, in the arrangement according to the invention, the side walls of the cavities consist of the electrically insulating material of the epoxy layer 2, it is made sure that the galvanic nickel deposition grows up from the copper surface at the bottom of the cavities so that spaces which are not completely filled with nickel will not be formed.

Figure 2:
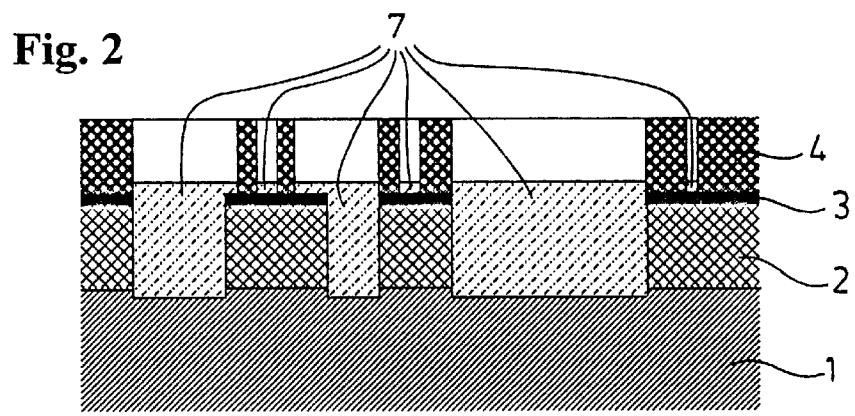
FIG. 2 shows the mold insert after nickel deposition has reached the level of an intermediate gold layer.

When the galvanic deposition has reached the gold layer 3, the gold layer is placed in electrical contact with the copper substrate by way of the nickel so that galvanic deposition will also start on the gold layer 3. As a result growth occurs in the cavities 6 as indicated schematically in FIG. 2., wherein the surface of the gold layer 3 is now in electric contact with the electrolyte. In this way, the galvanic deposition in the cavities 5 and 6 reaches the top surface of the PMMA layer 4 about at the same time and that the formation of pockets in the cavities 6 which are not completely filled with nickel is avoided. If the galvanic growth in some of the various cavities does not reach the upper edge of the PMMA layer 4 while it is reached in others, it is possible that the galvanic growth continues to the side and the cavities are overgrown at the top without being completely filled. As explained before with regard to the cavities 5, the electrically insulating walls of the PMMA layer 4 make sure that the cavities are completely filled with galvanically deposited nickel by preventing galvanic nickel deposition on their walls. The galvanic deposition is started in the cavities 6 by way of the electrically conductive gold layer 3. There is no need for a direct connection between the cavities 5 and the cavities 6.

Figure 3:
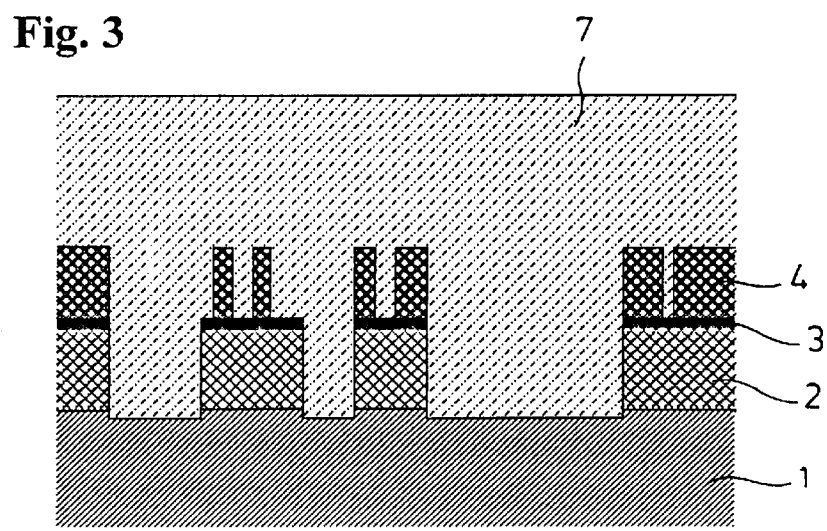
FIG. 3 shows the nickel layer on the substrate completed for use as a mold insert.

The galvanic deposition was continued beyond the edge of the PMMA layer 4, so that, as schematically shown in FIG.3, a nickel structure 7 was formed from which, after the removal of the substrate 1 and the layers 2, 3 and 4, a mold insert could be prepared.

Figure 4:
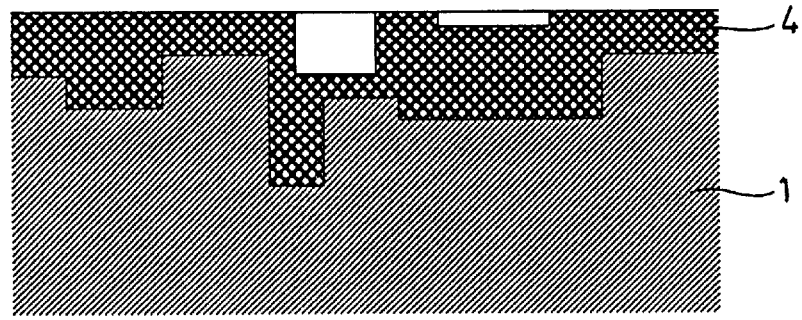
FIG. 4 shows a copper substrate mechanically provided with a microstructure and a structured PMMA layer.
Figure 5:
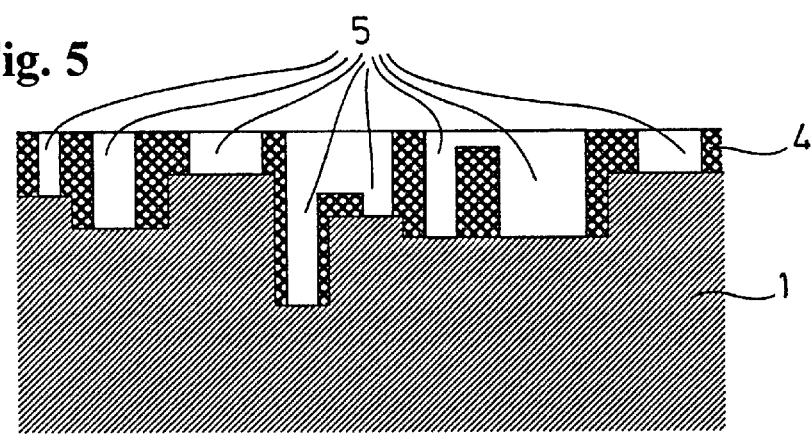
FIG. 5 shows the copper substrate with PMMA further structured by x-ray depth lithography.
Figure 6:
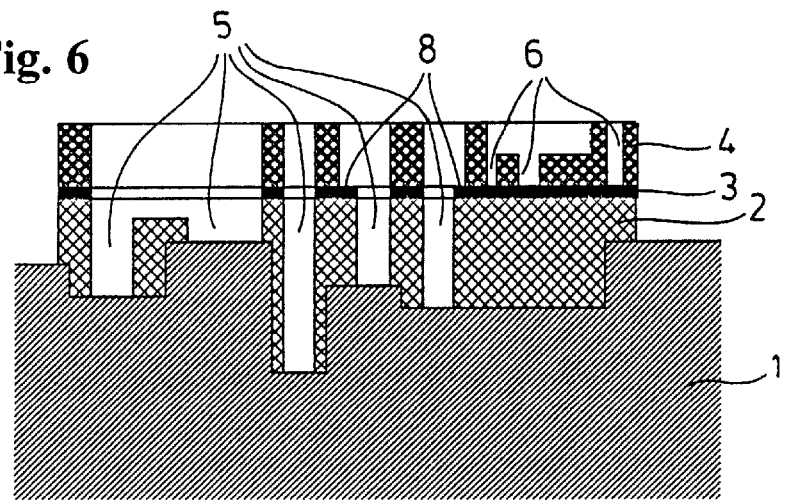
FIG. 6 shows a substrate with mechanically provided microstructures with a metal layer promoting equal galvanic growth.

In the embodiment as shown in FIGS. 4, 5, and 6 mold inserts with several structure planes were made by a combination of x-ray depth lithography and mechanical precision treatment.

As shown in FIG. 4, a copper substrate 1 is first provided with a microstructure by milling and drilling. Onto this substrate, a PMMA layer 4 is polymerized and also provided with several structure planes by mechanical precision working. The PMMA 4 is then structured by the well known methods of x-ray depth lithography adjusted relative to the structures already present on the substrate 1 as it is shown schematically in FIG. 5. The design of the structures is so selected that the lateral shape of the microstructures of the mold insert is defined by the exposure of the PMMA layer 4 to x-radiation. Because of the greater resolution of the x-ray depth lithography microstructures with finer lateral shapes can be made than it is possible by precision mechanical forming procedures. Furthermore, the design is so selected that the side walls of the structures are formed by PMMA so that the galvanic deposition grows up from the copper substrate 1 and the cavities 5 are completely filled galvanically with metal. With the different depths of the cavities 5 in the PMMA, it cannot be avoided, that the growth in the various cavities reaches the top edges of the cavities at different points in time. As a result, there are certain limitations concerning the lateral distances between the cavities 5 and their depth differences. On the other hand, this procedure permits the manufacture of mold inserts with several structure planes and small lateral dimensions in a particularly simple manner.

It is also possible to provide, like in the first embodiment, an epoxy resin layer 2 with a gold layer 3 and a PMMA layer 4 disposed on top of the gold layer 3 on a substrate 1 which has been mechanically precision treated. The epoxy resin layer is then mechanically precision cut and the PMMA layer is structured by x-ray depth lithography (see FIG. 6). In this case, the lateral dimensions of the cavities 5 are defined partially by the more precise x-ray depth lithography. By an appropriate selection of the design, it can be made sure that the side walls of the cavities are formed by electrically insulating material with the exception of the electrically conductive layer 3.

If the cavities 6 are, at least at a point 8, in direct contact, that is open at a certain point, it is in many cases possible to omit such an electrically conductive layer 3.

What is claimed is:

1. A method of manufacturing mold inserts by galvanic metal deposition, comprising the steps of: providing a substrate of an electrically conductive material, which cannot be structured lithographically, providing a structure on said substrate by mechanical precision machining, applying to said structured substrate a layer of an electrically insulating material which can be structured lithographically, structuring said electrically insulating material layer by depth lithography to form cavities therein, galvanically depositing a metal on said substrate so as to fill said cavities and cover said substrate with a metal structure, and separating said galvanically formed metal structure from said substrate and said structured layer.

2. A method according to claim 1, wherein, after structuring of the substrate by precision machining techniques, an electrically insulating layer which cannot be structured lithographically is deposited on the substrate and said layer which can be structured lithographically is deposited on said layer which cannot be structured lithographically and said electrically insulating layers are structured by mechanical precision machining.

3. A method according to claim 2, wherein an electrically conductive layer is deposited on said layer of insulating material which cannot be structured lithographically before said layer of material that can be structured lithographically is deposited.

\* \* \* \* \*